(12) United States Patent
Pelley et al.

(10) Patent No.: US 9,792,981 B2
(45) Date of Patent: Oct. 17, 2017

(54) MEMORY WITH READ CIRCUITRY AND METHOD OF OPERATING

(71) Applicant: FREESCALE SEMICONDUCTOR, INC., Austin, TX (US)

(72) Inventors: Perry H. Pelley, Austin, TX (US); Frank K. Baker, Jr., Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/869,419

(22) Filed: Sep. 29, 2015

(65) Prior Publication Data

US 2017/0092354 A1    Mar. 30, 2017

(51) Int. Cl.
  G11C 11/00    (2006.01)
  G11C 13/00    (2006.01)
  G11C 11/16    (2006.01)
  G11C 5/14     (2006.01)

(52) U.S. Cl.
  CPC ........ G11C 13/004 (2013.01); G11C 11/1673 (2013.01); G11C 11/1697 (2013.01); G11C 13/0007 (2013.01); G11C 13/0038 (2013.01); G11C 5/145 (2013.01); G11C 11/1675 (2013.01); G11C 13/0069 (2013.01)

(58) Field of Classification Search
  CPC .............. G11C 13/004; G11C 13/0069; G11C 13/0007
  See application file for complete search history.

(56) References Cited

U.S. PATENT DOCUMENTS

| | | | |
|---|---|---|---|
| 4,809,225 A | 2/1989 | Dimmler et al. | |
| 4,980,859 A | 12/1990 | Guterman et al. | |
| 5,535,154 A | 7/1996 | Kiyono | |
| 6,980,459 B2 | 12/2005 | Seshadri et al. | |
| 7,079,415 B2 | 7/2006 | Frey | |
| 2013/0016557 A1* | 1/2013 | Kim .................. | G11C 13/0004 365/163 |

FOREIGN PATENT DOCUMENTS

| | | |
|---|---|---|
| JP | 60144977 A | 7/1985 |
| JP | 1927276 C | 1/1986 |
| JP | 2002109875 A | 4/2002 |
| JP | 2011081896 A | 4/2011 |
| KR | 20020002823 A | 1/2002 |

OTHER PUBLICATIONS

U.S. Appl. No. 14/682,475, Pelley, P. et al., "Mismatch-Compensated Sense Amplifier for Highly Scaled Technology", filed Apr. 9, 2015.
U.S. Appl. No. 14/588,177, Pelley, P. et al., "Non-Volatile Static Random Access Memory (NVSRAM)", filed Dec. 31, 2014.

* cited by examiner

*Primary Examiner* — Pho M Luu
*Assistant Examiner* — Mohammed A Bashar

(57) ABSTRACT

A non-volatile memory includes a first bit cell having a programmable resistive element coupled to a write bit line wherein the programmable resistive element is programmable to one of two resistive states, a resistive element coupled to the programmable resistive element at a circuit node, and a first transistor configured to operate in saturation during a read operation. The first transistor has a control electrode coupled to the circuit node and a first current electrode coupled to a read bit line.

20 Claims, 4 Drawing Sheets

US 9,792,981 B2

MEMORY WITH READ CIRCUITRY AND METHOD OF OPERATING

BACKGROUND

Field

This disclosure relates generally to memories, and more particularly to a read operation in the memory.

Related Art

Non-volatile static random access memories (NVS-RAMs) hold the promise of having the benefits of both non-volatile memories (NVMs) and static random access memories (SRAMs). A type of NVM that is of particular interest is the resistive RAM (RRAM) which has a programmable resistor as the non-volatile element. The accessing for speed of reading and writing is desired to be similar to that of SRAMs. One of the difficulties has been obtaining access speeds, especially the speed of reading, comparable to that of SRAMs. The write speed may be slower as well but much, much faster than typical NVMs. Accordingly there is a need to provide a memory with improved read speed.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In variable resistance NVSRAMs, it is difficult to obtain read times which compare with SRAM speeds. For example, in a magneto resistive RAM (MRAM), typically only a 2:1 ratio exists between the high- to low-resistive states. This results in a small signal to sense. In some resistive RAMs, very low read currents are provided, which makes it difficult to rapidly sense the data stored in the bit cell. Therefore, in one aspect, for a read, a selected bit cell's variable resistance is ratioed against a fixed reference resistor which tracks bit cell process variations. A read transistor operating in saturation acts as a gain stage providing a greater low-resistance state\high-resistance state read current ratio. In another aspect, an isolation transistor and a boost capacitor are used on a read bit line to improve the read operation of a bit cell.

Figure 1:
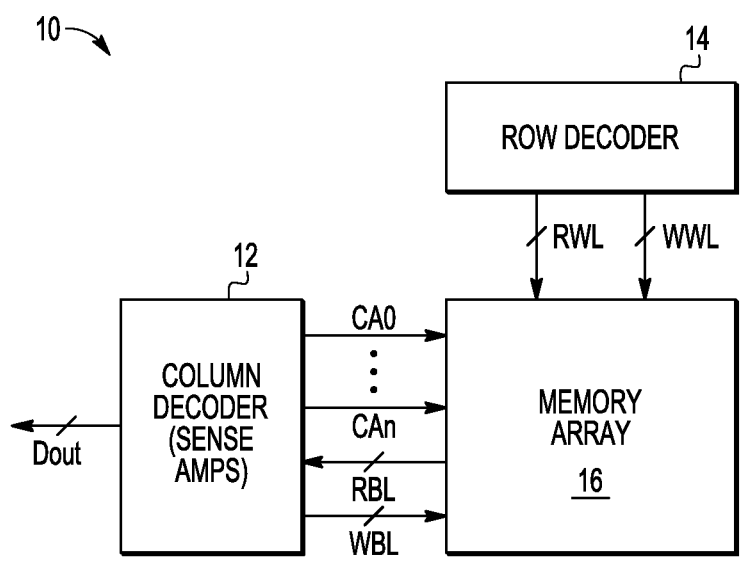
FIG. 1 illustrates, in block diagram form, an NVSRAM in accordance with one embodiment of the present invention.

FIG. 1 illustrates an NVSRAM 10 in accordance with one embodiment of the present invention. Since the discussions herein focus on the read operation of bit cells, the write circuitry is not illustrated. NVSRAM 10 includes a memory array 16, a row decoder 14, and a column decoder 12. Memory array 16 includes a plurality of bit cells addressable by read and write word lines (RWL, WWL) and a column address signal (CA0-CAn) in which a logic state of the addressed bit cell is determined by sensing the read bit line (RBL) of the addressed bit cell. In one embodiment, the plurality of bit cells are arranged into blocks of n+1 bit cells, in which each block has a shared read word line (RWL), shared write bit line (WBL), and shared read bit line (RBL), and the column address signals operate to select one bit cell of the block. For a read operation, only one of the decoded column address signals is selected to be active. A read word line is selected to be active, and a read bit line corresponding to the selected bit cell receives the data of the selected bit cell. The sense amplifiers in column decoder 12 can then sense the read bit line to determine the value stored in the selected bit cell and provide the value as a bit of the output value, Dout. Alternatively, no sense amplifiers may be needed if the signal on the read bit line need not be amplified to determine the value.

Figure 2:
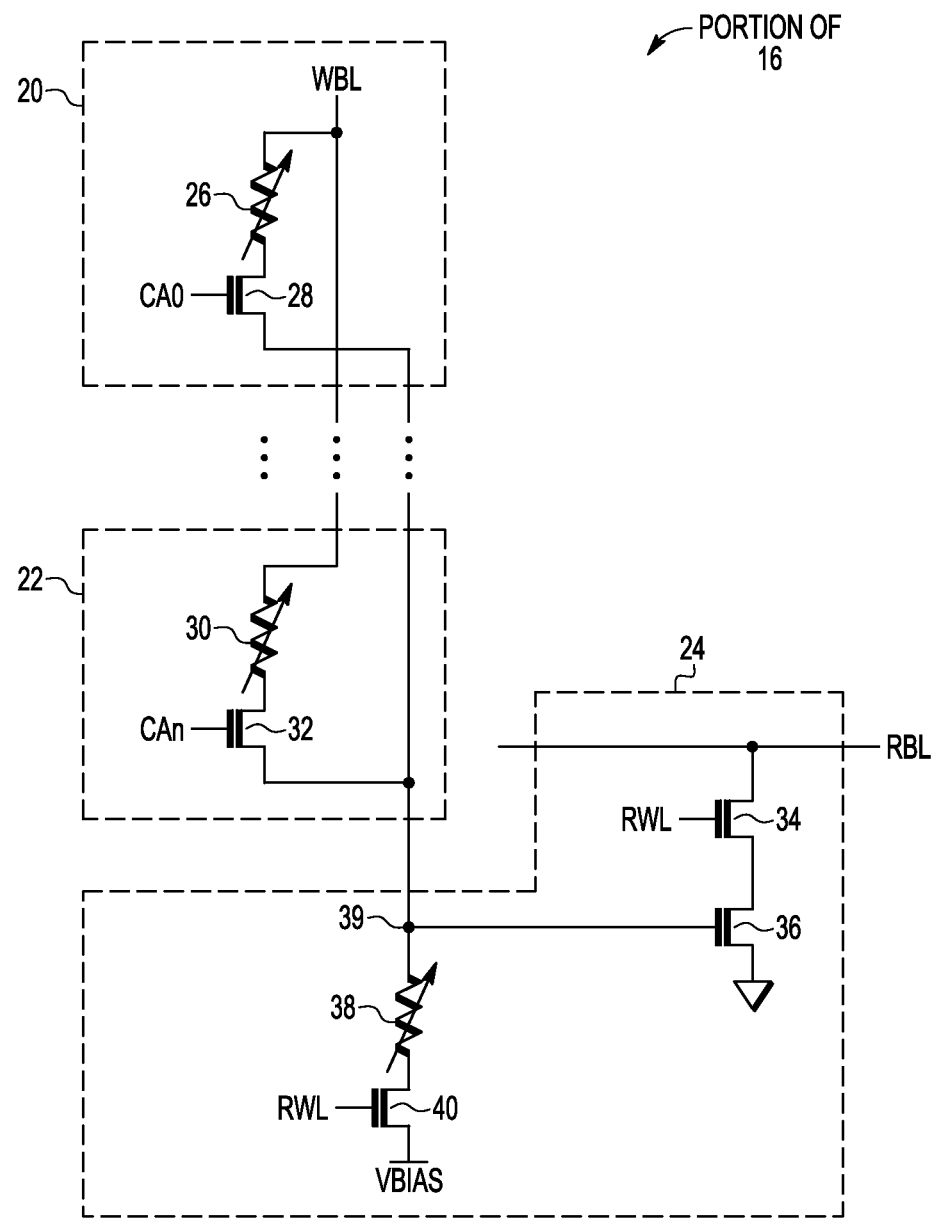
FIG. 2 illustrates, in schematic diagram form, a portion of the NVSRAM of FIG. 1 that shows elements useful for a read, in accordance with one embodiment of the present invention.

FIG. 2 illustrates, in schematic form, a portion of array 16 in accordance with one embodiment of the present invention. FIG. 2 illustrates a block of n+1 bit cells, including bit cells 20 and 22. The block of bit cells also includes a share read block 24 which includes read circuitry for the n+1 bit cells. In the illustrated embodiment, each bit cell includes a programmable resistor and a read transistor enabled by a column address signal. For example, bit cell 20 includes a programmable resistor 26 and an n-type read transistor 28. A first terminal of programmable resistor 26 is coupled to a first write bit line (WBL) which can be any write bit line of array 16. A second terminal of programmable resistor 26 is coupled to a first current electrode of transistor 28, a second current electrode of transistor 28 is coupled to a circuit node 39, and a control electrode of transistor 28 is coupled to receive a first column address signal, CA0. Similarly, bit cell 22 includes a programmable resistor 30 and an n-type read transistor 32. A first terminal of programmable resistor 30 is coupled to WBL, and a second terminal of programmable resistor 30 is coupled to a first current electrode of transistor 32, a second current electrode of transistor 32 is coupled to circuit node 39, and a control electrode of transistor 30 is coupled to receive another column address signal, CAn.

Shared read block 24 includes a resistor 38 having a first terminal coupled to circuit node 39, and a second terminal coupled to a first current electrode of an n-type transistor 40. A second current electrode of n-type transistor 40 is to a voltage supply, VBIAS, and a control electrode of transistor 40 is coupled to RWL, which can be any RWL of array 16. Resistor 38 may be a same type of programmable resistor as the programmable resistors in the bit cells. This allows resistor 38 to track the same process variations as the bit cell. Resistor 38 is set to a fixed value, such as 10 K Ohms, by, for example, application of a magnetic field. Share read block 24 also includes n-type transistors 34 and 36. A first current electrode of transistor 34 is coupled to RBL, which can be any RBL of array 16, and a control electrode of transistor 34 is coupled to RWL. A first current electrode of transistor 36 is coupled to a second current electrode of transistor 34, a control electrode of transistor 36 is coupled to circuit node 39, and a second current electrode of transistor 36 is coupled to ground.

Note that in alternate embodiments, each bit cell may include the read circuitry of block 24 in which the read circuitry is not shared among a plurality of bit cells In operation, each programmable resistor is capable of being programmed into a high resistive state (HRS) or a low resistive state (LRS), in which each of the two resistive states corresponds to a different logic state. For example, a HRS may correspond to a logic level "1" and a LRS to a logic level "0", or vice versa. The different resistive states for a programmable resister can be achieve by flowing current in opposite directions through the resistor. That is, for a write of a programmable resistor, current is flowed in one direction through the programmable resistor for a logic "1" and the opposite direction for a logic "0." All the write circuitry for writing the programmable resistors in this manner is not illustrated and can be implemented using known techniques. In the illustrated embodiment of FIG. 2, it is assumed that each programmable resistor has been programmed to either a HRS or a LRS. In one embodiment, the ratio of resistance between a HRS and a LRS is 2:1. For example, the HRS may correspond to 10 K Ohms and the LRS to 5 K Ohms. The resistance of resistor 38 can be programmed to match the HRS, which, in this example, is 10 K Ohms.

For a read operation, it is assumed that one of the bit cells in the block of FIG. 2 is addressed by activating WBL and RWL, and by activating one of the column address signals. As discussed above, only one of CA0-CAn is activated (i.e. asserted) for a read of a bit cell coupled to WBL. For example, if CA0 is asserted, transistor 28 is turned on and the remaining read transistors of the block, such as transistor 32, are turned off. Therefore, programmable resistor 26 is coupled to resistor 38 as a voltage divider in which node 39 corresponds to the voltage divider node. For the read operation, with RWL activated, both transistors 40 and 34 are turned on. Depending on whether resistor 26 is in a HRS or LRS (determined by the stored logic state of bit cell 20), the voltage at node 39 is moves lower or higher, respectively, due to the voltage divider created by resistors 26 and 38. Note that the limit on read voltages that can be applied to the programmable resistors is small, and VBIAS is set so that the read voltages do not exceed their limits. For example, in one embodiment, the read voltages cannot exceed 0.5 volts, so VBIAS is set accordingly.

The variation in voltage of node 39 between a bit cell that is in a LRS or a HRS is small and difficult to sense. Therefore, transistor 36, which operates in saturation, acts as a gain stage providing a larger LRS/HRS read current ratio. With transistor 34 turned on, the voltage on node 39 sets the current in RBL which can then be sensed directly, if large enough, or via sense amplifiers. Resistor 26 being in an HRS results in a smaller current through transistor 36 than when resistor 26 is in an LRS with the ratio between the currents being greater than 2:1. Therefore, the voltage of RBL drops more quickly when resistor 26 is in LRS than a HRS. The lower current or higher current in RBL corresponds to the logic state stored in the sensed bit cell. By transistor 36 operating in saturation, it is more sensitive to changes in voltage on its gate. That is, the source-drain current changes more with respect to gate voltage than it does when not in saturation. Transistor 36 remains in saturation since the gate-to-source voltage (Vgs) of transistor 36 minus the threshold voltage (Vt) of transistor 36 is less than the drain to source voltage (Vds) of transistor 36. Note that transistor 36 can be ensured to operate in saturation by appropriately selecting an initial precharge voltage on RBL, the WBL bias, and the value of VBIAS.

Figure 3:
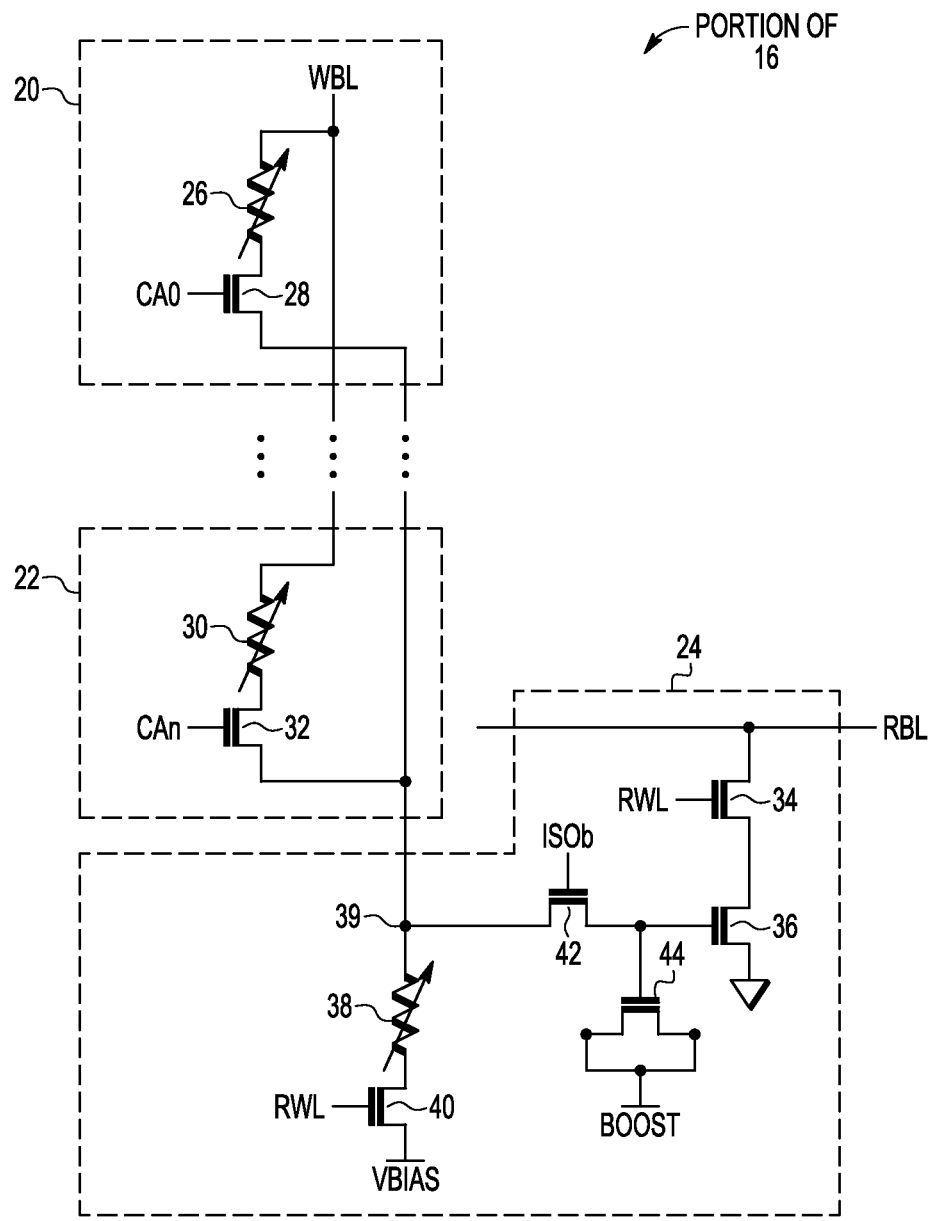
FIG. 3 illustrates, in schematic diagram form, a portion of the NVSRAM of FIG. 1 that shows elements useful for a read, in accordance with one embodiment of the present invention.

FIG. 3 illustrates, in schematic form, a portion of array 16 in accordance with one embodiment of the present invention in which like numbers with FIG. 2 indicate like elements. In FIG. 3, shared read block 24 is replaced with a shared read block 46, which includes transistors 40, 34, and 36, and resistor 38, and further includes n-type transistor 42 and capacitor 44. In the illustrated embodiment, capacitor 44 is implemented as a Metal Oxide Semiconductor (MOS) capacitor with an n-type transistor having a connected source and drain. In shared read block 46, a first current electrode of transistor 42 is coupled to node 39, a control electrode of transistor 42 is coupled to receive the inverse of an isolation signal, ISOb, and a second current electrode of transistor 42 is coupled to the control gate of transistor 36 and the control gate of transistor 44. The first and second control electrodes (the source and drain) of transistor 42 are connected to each other and coupled to a boost signal.

Figure 4:
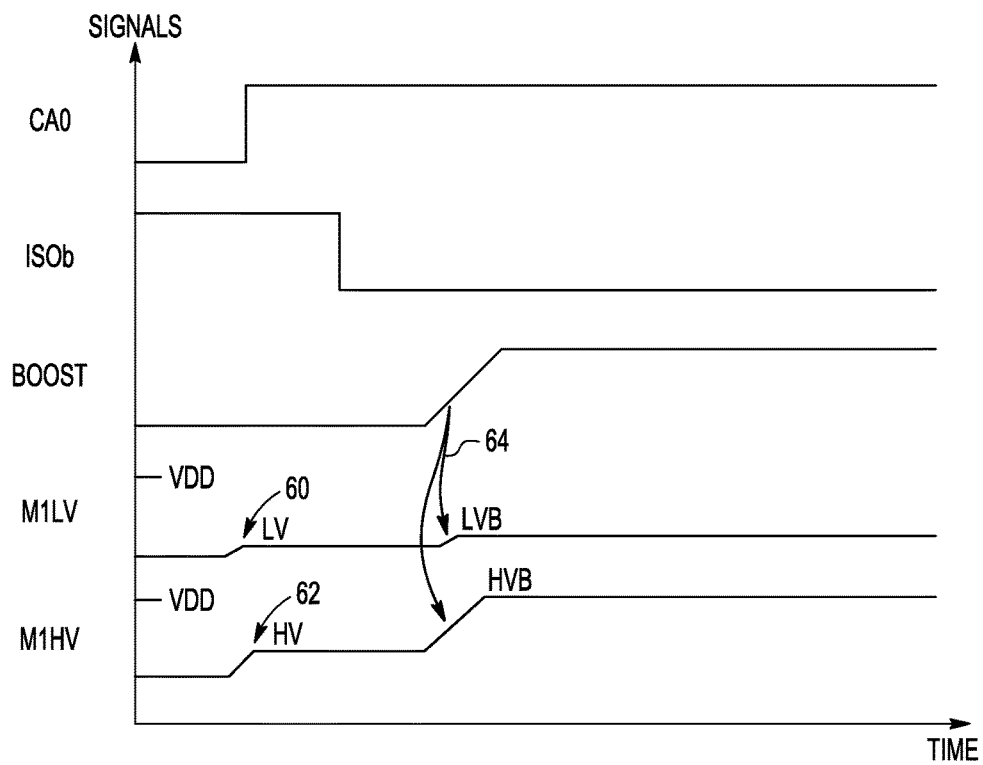
FIG. 4 illustrates, in timing diagram form, various signals of FIG. 3 in accordance with one embodiment of the present invention.
Figure 5:
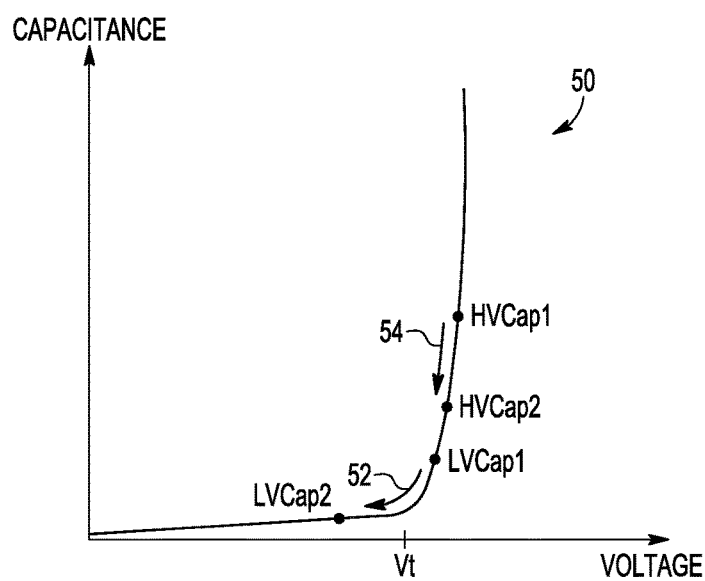
FIG. 5 illustrates a capacitance vs. voltage curve for a device in FIG. 2 in accordance with one embodiment of the present invention.

FIG. 4 illustrates an example of the signals in FIG. 3 during a read operation. As described above with respect to FIG. 2, the voltage at node 39 varies in accordance with the logic state stored in the sensed bit cell. For FIGS. 3 and 4, it is again assumed that for the read operation, CA0 is asserted (and thus the other column address signals, CA1-CAn, are negated). FIG. 5 illustrates a gate voltage-capacitance curve for capacitor 44. Note that when the gate voltage of capacitor 44 is below the threshold voltage of the capacitor 44 (implemented as a transistor), the capacitance is low, close to zero. However, as the gate voltage increases from the threshold voltage (once the channel forms in the transistor), the capacitance of capacitor 44 increases steeply. For example, the capacitance decreases slightly from LVCap1 to LVCap2, as indicated by arrow 52, when the voltage at the gate of capacitor 44 fall below Vt. However, as indicated by arrow 54, the capacitance moves from a high capacitance HVCap1 to a steeply lower capacitance, but still well above 0, while the voltage of the gate remains above Vt. As will be seen below, this behavior allows capacitor 44 to operate as a capacitor amplifier for transistor 36.

Referring to FIGS. 3 and 4, for a read operation, RWL is asserted and, since bit cell 20 is being read, CA1 is asserted. Therefore, transistors 40, 34, and 28 are on. After the read operation begins, node 39 reaches its voltage value based on the comparative resistances of resistors 26 and 38, as described above in reference to FIG. 2. Also, at this point, ISOb is negated (at a logic level one) and therefore transistor 42 is on, and the voltage of VBIAS ensures that transistor 36 is turned on. As described above, node 39 has a low voltage value or a high voltage value, depending on the programmed state of bit cell 20. As indicated by arrow 60, in the case of the low voltage, the voltage on the gate of transistor 36 reaches LV, and, as indicated by arrow 62, in the case of the high voltage, the voltage on the gate of transistor 36 reaches HV. Note that HV is at higher voltage value than LV. In one embodiment, VBIAS is set so that LV on the gate of transistor 36 is about the Vt of transistor 36.

After the voltages reach LV or HV, ISOb is asserted so as to turn off transistor 42 and thus isolate capacitor 44 and transistor 36 from node 39. After ISOb is asserted, the BOOST signal is ramped high. As indicated by arrows 64, this results in LV being boosted to a higher low voltage, LVB, or results in HV being boosted to a higher high voltage, HVB. The value of LVB on the gate of transistor 36 maintains it on, but to a lesser extent as compared to HVB which turns transistor 36 fully on.

Referring to FIG. 5, the voltage LV is below the thresholds voltage Vt of capacitor 44 and the voltage HV is above the threshold voltage Vt of capacitor 44. In this manner, in the case of the voltage at the gate of transistor 36 being LV, the capacitance of capacitor 44 is almost zero, thus there is little charge sharing with transistor 36. Therefore, the voltage at the gate of transistor 36, once boosted to LVB remains at LVB for the duration of the read, as the charge stored in capacitor 44 quickly runs out. However, when the voltage at the gate of transistor 36 is at HV, which is above the threshold voltage Vt of capacitor 44, capacitor 44 remains with a high capacitance, well above 0 (similar to the capacitances of HVCap1 or HVCap2 of FIG. 5 which is on the steep portion of the curve). In this case, capacitor 44 charge shares with transistor 36, and the voltage is boosted to HVB and remains at HVB, ensuring that transistor 36 stays on for the duration of the read. The voltage on the gate of transistor 36 controls the current on RBL such that when the gate of transistor 36 is at HVB, the current in RBL is less than when the voltage on the gate of transistor 36 is at LVB. The state of the bit cell can then be determined from the value of RBL directly or with sense amplifiers. With the gate of transistor 38 either staying at LVB or going up to HVB based on the state of the bit cell, the use of capacitor 44 allows for a bigger difference in the current of RBL between the two states.

Note that capacitor 44 and isolation transistor 42 can be used in combination with any bit cell and is not limited to just NVSRAM bit cells. The different amounts of charge sharing between capacitor 44 and transistor 36 can be used to amplify the current difference coming from any type of memory cells, such as a dynamic random access memory (DRAM) cell, a resistive random access memory (RRAM) cell, or a magnetoresistive resistor random access (MRAM) cell. For example, the signal from a DRAM or flash bit line can be isolated and boosted or not boosted depending on the voltage on capacitor 44, thereby selectively amplifying the signal. In a similar manner, a pair of capacitors (such as capacitor 44) can be used to selectively amplify the isolated signal from an SRAM bit line and complementary bit line.

Therefore, by now it can be appreciated how a read of an NVSRAM bit cell can be made faster through the use of a fixed resistor in combination with the programmable resistor and a transistor in saturation. The transistor being in saturation improves the sensitivity of the RBL to changes in the value of the variable resistor. Also, it can be appreciated how the use of a MOS capacitor in combination with an isolation transistor also allows for improved sensing of RBL.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a lower case (b) or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. For example, although FIG. 1 and the discussion thereof describe an exemplary memory architecture, this exemplary memory architecture is presented merely to provide a useful reference in discussing various aspects of the invention. Of course, the description of the memory architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Although the invention is described herein with reference to specific embodiments, various modifications and changes can be made without departing from the scope of the present invention as set forth in the claims below. For example, the capacitor 44 and isolation transistor 42 can be coupled to a different type of bit cell, and not necessarily and NVSRAM bit cell. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a non-volatile memory includes a first bit cell having a programmable resistive element coupled to a write bit line wherein the programmable resistive element is programmable to one of two resistive states; a resistive element coupled to the programmable resistive element at a circuit node; and a first transistor configured to operate in saturation during a read operation and having a control electrode coupled to the circuit node and a first current electrode coupled to a read bit line. In one aspect of the above embodiment, the non-volatile memory further includes a second transistor having a first current electrode coupled to the resistive element, a second current electrode coupled to a bias voltage supply node, and a control electrode coupled to receive a read word line, wherein the resistive element is coupled between the circuit node and the second transistor. In a further aspect, the read word line is configured to be asserted to turn on the second transistor during the read operation. In another further aspect, the non-volatile memory further includes a third transistor having a first current electrode coupled to the read bit line; a second current electrode coupled to the first current electrode of the first transistor such that the third transistor is coupled between the read bit line and the first transistor, and a control electrode coupled to receive the read word line. In yet a further aspect, the read word line is configured to be asserted to turn on the second transistor and the third transistor during the read operation. In another aspect, the read word line is configured to be asserted to turn on the second transistor during the read operation. In another aspect, the non-volatile memory further includes a plurality of bit cells, including the first bit cell, wherein each of the plurality of bit cells has a programmable resistive element coupled to the write bit line, wherein each programmable resistive element is programmable to one of two resistive states. In a further aspect, each bit cell of the plurality of bit cells comprises a select transistor having a first electrode coupled to the programmable resistive element of the bit cell, a second current electrode coupled to the resistor, and a control electrode coupled to receive a column select signal. In yet a further aspect, during the read operation, only one of the column select signals is configured to be asserted to couple only one of the plurality of bit cells directly to the circuit node to form a voltage divider. In another aspect, the non-volatile memory further includes an isolation transistor having a first current electrode coupled to the circuit node, a second current electrode coupled to the control gate of the first transistor, and a control electrode coupled to receive an isolation signal, which, when asserted, is configured to isolate the control electrode of the first transistor from the circuit node; and a Metal Oxide Semiconductor (MOS) capacitor having a first terminal coupled to the control electrode of the first transistor and a second terminal coupled to receive a boost signal, which, during a read operation, is configured to provide a boost voltage. In a further aspect, the MOS capacitor comprises a fourth transistor having a control electrode which serves as the first terminal and having a first current electrode connected directly to the second current electrode and coupled to receive the boost signal.

In another embodiment, a non-volatile memory includes a first bit cell coupled a circuit node, wherein a state of the first bit cell affects voltage at the circuit node; a first transistor having a first current electrode coupled to the circuit node, a second current electrode, and a control electrode coupled to receive an isolation signal; a second transistor having a control electrode coupled to the second current electrode of the first transistor and a first current electrode coupled to a read bit line; and a Metal Oxide Semiconductor (MOS) capacitor having a first terminal coupled to the control electrode of the second transistor and a second terminal coupled to receive a boost signal, which, during a read operation, is configured to provide a boost voltage. In one aspect of the another embodiment, the MOS capacitor comprises a third transistor having a control electrode which serves as the first terminal, and having a first current electrode connected directly to the second current electrode and coupled to receive the boost signal. In another aspect, the MOS capacitor is configured to, in response to a first state stored in the first bit cell, have a first capacitance and in response to a second state stored in the first bit cell, have a second capacitance, greater than the first capacitance. In a further aspect, after application of the boost voltage, the second capacitance is sufficient to fully turn on the second transistor during the read operation. In another aspect, during a first portion of the read operation, the isolation signal is negated such that the first transistor is on, and during a second portion of the read operation, subsequent the first portion, the isolation signal is asserted such that the first transistor is off. In another aspect, non-volatile memory further includes a plurality of bit cells, including the first bit cell, wherein each of the plurality of bit cells is coupled to the circuit node such that the first transistor, second transistor, and MOS capacitor are configured to be used for a read operation of any one of the plurality of bit cells. In a further aspect, each bit cell of the plurality of bit cells comprises a select transistor coupled to receive a column select signal, wherein during the read operation, only one of the column select signals is configured to be asserted to couple only one of the plurality of bit cells directly to the circuit node.

In yet another embodiment, in a non-volatile memory, a method includes selecting a first bit cell having a programmable resistive element for a read operation wherein the programmable resistive element is programmable to one of two resistive states; during the read operation, operating a first transistor in saturation, wherein the first transistor has a control electrode coupled to a circuit node and a first current electrode coupled to a read bit line, and coupling the first bit cell to the circuit node, wherein the non-volatile memory includes a resistive element coupled to the circuit node; and sensing the read bit line to determine a state of the selected first bit cell. In one aspect of the yet another embodiment, after initiating the read operation and prior to sensing the read bit line, the method further includes isolating the control electrode of the first transistor from the circuit node; and applying a capacitance to the control electrode of the first transistor, wherein the capacitance is coupled between the control electrode of the first transistor and a boost signal, wherein the boost signal provides a boost voltage during the read operation after the isolation of the control electrode of the first transistor from the circuit node.

What is claimed is:
1. A non-volatile memory comprising:
  a first bit cell having a programmable resistive element coupled to a write bit line wherein the programmable resistive element is programmable to one of two resistive states;
  a resistive element coupled to the programmable resistive element at a circuit node; and
  a first transistor configured to operate in saturation during a read operation and having a gate control electrode directly coupled to the circuit node and a first current electrode coupled to a read bit line.
2. The non-volatile memory of claim 1, further comprising:
  a second transistor having a first current electrode coupled to the resistive element, a second current electrode coupled to a bias voltage supply node, and a control electrode coupled to receive a read word line, wherein the resistive element is coupled between the circuit node and the second transistor.

3. The non-volatile memory of claim 2, wherein the read word line is configured to be asserted to turn on the second transistor during the read operation.

4. The non-volatile memory of claim 2, further comprising:
a third transistor having a first current electrode coupled to the read bit line; a second current electrode coupled to the first current electrode of the first transistor such that the third transistor is coupled between the read bit line and the first transistor, and a control electrode coupled to receive the read word line.

5. The non-volatile memory of claim 4, wherein the read word line is configured to be asserted to turn on the second transistor and the third transistor during the read operation.

6. The non-volatile memory of claim 2, wherein the read word line is configured to be asserted to turn on the second transistor during the read operation.

7. The non-volatile memory of claim 1, further comprising a plurality of bit cells, including the first bit cell, wherein each of the plurality of bit cells has a programmable resistive element coupled to the write bit line, wherein each programmable resistive element is programmable to one of two resistive states.

8. The non-volatile memory of claim 7, wherein each bit cell of the plurality of bit cells comprises a select transistor having a first electrode coupled to the programmable resistive element of the bit cell, a second current electrode coupled to the resistor, and a control electrode coupled to receive a column select signal.

9. The non-volatile memory of claim 8, wherein, during the read operation, only one of the column select signals is configured to be asserted to couple only one of the plurality of bit cells directly to the circuit node to form a voltage divider.

10. The non-volatile memory of claim 1, further comprising:
an isolation transistor having a first current electrode coupled to the circuit node, a second current electrode coupled to the control gate of the first transistor, and a control electrode coupled to receive an isolation signal, which, when asserted, is configured to isolate the control electrode of the first transistor from the circuit node; and
a Metal Oxide Semiconductor (MOS) capacitor having a first terminal coupled to the gate control electrode of the first transistor and a second terminal coupled to receive a boost signal, which, during a read operation, is configured to provide a boost voltage.

11. The non-volatile memory of claim 10, wherein the MOS capacitor comprises a fourth transistor having a control electrode which serves as the first terminal and having a first current electrode connected directly to the second current electrode and coupled to receive the boost signal.

12. A non-volatile memory, comprising:
a first bit cell coupled a circuit node, wherein a state of the first bit cell affects voltage at the circuit node;
a first transistor having a first current electrode coupled to the circuit node, a second current electrode, and a control electrode coupled to receive an isolation signal;
a second transistor having a control electrode coupled to the second current electrode of the first transistor and a first current electrode coupled to a read bit line; and
a Metal Oxide Semiconductor (MOS) capacitor having a first terminal coupled to the control electrode of the second transistor and a second terminal coupled to receive a boost signal, which, during a read operation, is configured to provide a boost voltage.

13. The non-volatile memory of claim 12, wherein the MOS capacitor comprises a third transistor having a control electrode which serves as the first terminal, and having a first current electrode connected directly to the second current electrode and coupled to receive the boost signal.

14. The non-volatile memory of claim 12, wherein the MOS capacitor is configured to, in response to a first state stored in the first bit cell, have a first capacitance and in response to a second state stored in the first bit cell, have a second capacitance, greater than the first capacitance.

15. The non-volatile memory of claim 14, wherein, after application of the boost voltage, the second capacitance is sufficient to fully turn on the second transistor during the read operation.

16. The non-volatile memory of claim 12, wherein during a first portion of the read operation, the isolation signal is negated such that the first transistor is on, and during a second portion of the read operation, subsequent the first portion, the isolation signal is asserted such that the first transistor is off.

17. The non-volatile memory of claim 12, further comprising a plurality of bit cells, including the first bit cell, wherein each of the plurality of bit cells is coupled to the circuit node such that the first transistor, second transistor, and MOS capacitor are configured to be used for a read operation of any one of the plurality of bit cells.

18. The non-volatile memory of claim 17, wherein each bit cell of the plurality of bit cells comprises a select transistor coupled to receive a column select signal, wherein during the read operation, only one of the column select signals is configured to be asserted to couple only one of the plurality of bit cells directly to the circuit node.

19. In a non-volatile memory, a method comprises:
selecting a first bit cell having a programmable resistive element for a read operation wherein the programmable resistive element is programmable to one of two resistive states;
during the read operation, operating a first transistor in saturation, wherein the first transistor has a gate control electrode directly coupled to a circuit node and a first current electrode coupled to a read bit line, and coupling the first bit cell to the circuit node, wherein the non-volatile memory includes a resistive element coupled to the circuit node; and
sensing the read bit line to determine a state of the selected first bit cell.

20. The method of claim 19, wherein after initiating the read operation and prior to sensing the read bit line, the method further comprises:
isolating the gate control electrode of the first transistor from the circuit node; and
applying a capacitance to the control electrode of the first transistor, wherein the capacitance is coupled between the gate control electrode of the first transistor and a boost signal, wherein the boost signal provides a boost voltage during the read operation after the isolation of the gate control electrode of the first transistor from the circuit node.

* * * * *